(12) United States Patent
Kabir et al.

(10) Patent No.: US 12,438,102 B2
(45) Date of Patent: Oct. 7, 2025

(54) HERMETIC BARRIER SURROUNDING A PLURALITY OF DIES

(71) Applicant: Intel Corporation, Santa Clara, CA (US)

(72) Inventors: Mohammad Enamul Kabir, Portland, OR (US); Keith Zawadzki, Portland, OR (US); Shakul Tandon, Hillsboro, OR (US); Christopher M. Pelto, Beaverton, OR (US); John Kevin Taylor, Portland, OR (US); Babita Dhayal, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 17/557,565

(22) Filed: Dec. 21, 2021

(65) Prior Publication Data
US 2023/0197638 A1    Jun. 22, 2023

(51) Int. Cl.
*H01L 23/00* (2006.01)
*H01L 21/52* (2006.01)
*H01L 25/065* (2023.01)

(52) U.S. Cl.
CPC ............ *H01L 23/564* (2013.01); *H01L 21/52* (2013.01); *H01L 25/0655* (2013.01)

(58) Field of Classification Search
CPC .... H01L 23/564; H01L 21/52; H01L 25/0655
USPC ......................................... 257/700
See application file for complete search history.

(56) References Cited

U.S. PATENT DOCUMENTS

| 5,381,039 A * | 1/1995 | Morrison .......... H01L 23/49555 |
| | | 257/E21.511 |
| 2016/0225742 A1* | 8/2016 | Davis ..................... H01L 25/50 |

\* cited by examiner

*Primary Examiner* — Quoc D Hoang
(74) *Attorney, Agent, or Firm* — Schwabe, Williamson & Wyatt, P.C.

(57) ABSTRACT

Embodiments described herein may be related to apparatuses, processes, and techniques for a barrier that surrounds one or more dies which are electrically coupled with one or more electrical connections on a wafer. The barrier may be a hermetic barrier that is formed on a wafer prior to singulation to prevent moisture intrusion from a side of the wafer that may compromise the one or more electrical connections. Other embodiments may be described and/or claimed.

20 Claims, 9 Drawing Sheets

HERMETIC BARRIER SURROUNDING A PLURALITY OF DIES

FIELD

Embodiments of the present disclosure generally relate to the field of semiconductor packaging, and in particular to hermetic seals between dies in a package.

BACKGROUND

Continued growth in virtual machines, cloud computing, and portable devices will continue to increase the demand for high density transistors within chips and packages.

DETAILED DESCRIPTION

Embodiments described herein may be related to apparatuses, processes, systems, and techniques directed to a barrier that surrounds one or more dies that are electrically coupled with one or more electrical connections. In embodiments, the dies may be referred to as integrated circuits (IC). In embodiments, the dies may be formed by using reticles on one or more mask layers during the wafer fabrication process. In embodiments, the barrier is a hermetic barrier that is placed on a wafer that includes multiple dies prior to singulation of the wafer. In embodiments, the hermetic barrier may prevent moisture intrusion from a side of a substrate between the multiple dies that includes the one or more electrical connections between the dies. By keeping moisture away from the one or more electrical connections, fatigue stress is lessened in this area of the substrate that includes the one or more electrical connections during operation and temperature cycling.

Semiconductors use different materials which may either degrade or corrode in the presence of moisture. If circuits are not protected from moisture, for example, during wafer manufacturing, packaging or in customer use, the circuits may either decrease in performance or cease to work. In legacy implementations, a hermetic ring around the die edge and a hermetic passivation at the top layer of the die are typically placed to prevent moisture from entering the circuits. In these legacy implementations, edge ring forms walls around the die edges and silicon and passivation form the base and the roof. If the ring, base, and roof are made from hermetic materials, the entire housing becomes hermetic, thus protecting the circuits present inside the housing from moisture. In addition, the ring around the die edge may help arrests edge cracks and may facilitate better thermo-mechanical reliability. An edge ring is usually manufactured out of metals, such as copper, aluminum, tungsten, cobalt, and the like. However, with products with multiple dies, there may be limited moisture blocking at a die edge using these legacy techniques.

In legacy implementations, a maximum die size within a semiconductor product may be determined by a reticle limit, for example a maximum field size of a lithography stepper. Techniques to increase the die size, or to pack more transistors within a single die, may be accomplished by stitching multiple dies together using one or more electrical connections between the multiple dies. In implementations, these one or more electrical connections between dies are placed within the upper layers of a substrate between the multiple dies, away from the wafer surface. In legacy implementations, during singulation, the resulting scribe area between the multiple dies is open to moisture intrusion. As a result, the package goes through environmental moisture exposure and temperature cycling during operation, a significant amount of corrosion and fatigue stress may be generated in this area, which may result in delamination and product failure.

In embodiments, the edge hermetic barrier, which may also be referred to as a moisture blocking ring or a guard ring, is placed around the edge of the stitched dies. In embodiments, the hermetic barrier may be created using a through silicon via (TSV) like process or a combination of a TSV like process and a layer-by-layer metal and dielectric process. In these embodiments, allowed layers above the TSV may be layers used for electrical connections between dies. In embodiments, the edge ring, which may include TSV based metal structures and metal brick structures may be made of metals such as copper, aluminum, tungsten, cobalt, and the like.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may include "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1:
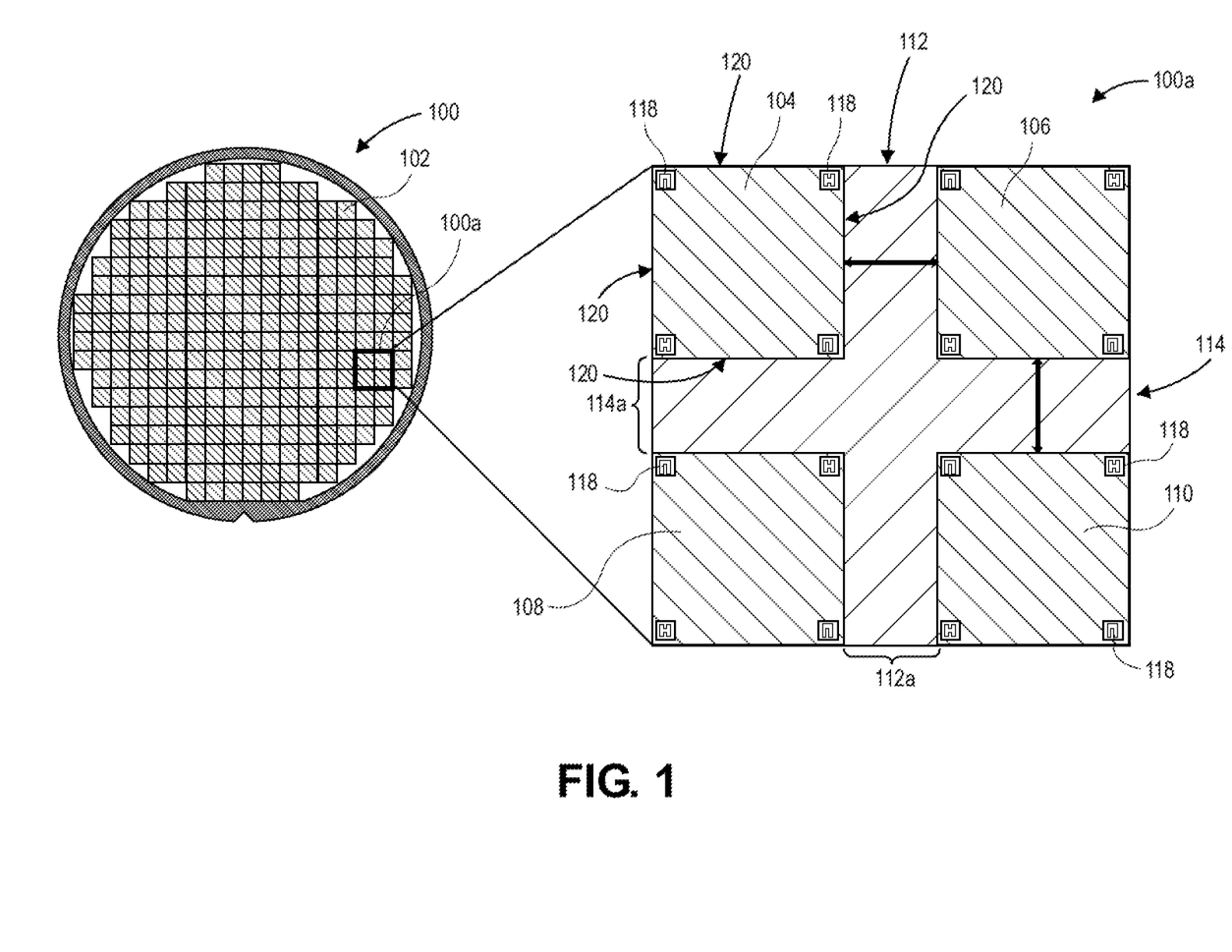
FIG. 1 shows a top-down legacy view of a wafer and an explosion view of multiple dies on the wafer with dicing streets for singulation.

FIG. 1 shows a top-down legacy view of a wafer and an explosion of multiple dies on the wafer with dicing streets for singulation. Wafer 100 shows an example of a plurality of individual dies 102 of an integrated circuit prior to singulation. Explosion 100a shows four dies 104, 106, 108, 110 that are separated by dicing street 112 in a first direction and dicing street 114 in a second direction, orthogonal to the first direction. A width 112a, 114a of the respective dicing streets are selected based upon a scribe width, which is dependent upon the singulation technology used to separate the plurality of individual dies 102. In implementations, alignment marks for dicing or wafer processing 118 may be included with each of the dies 104, 106, 108, 110. In this implementation, each of the dies 102, 104, 106, 108, 110 may be sealed hermetically through metal walls 120 around the edge of each die.

Figure 2:
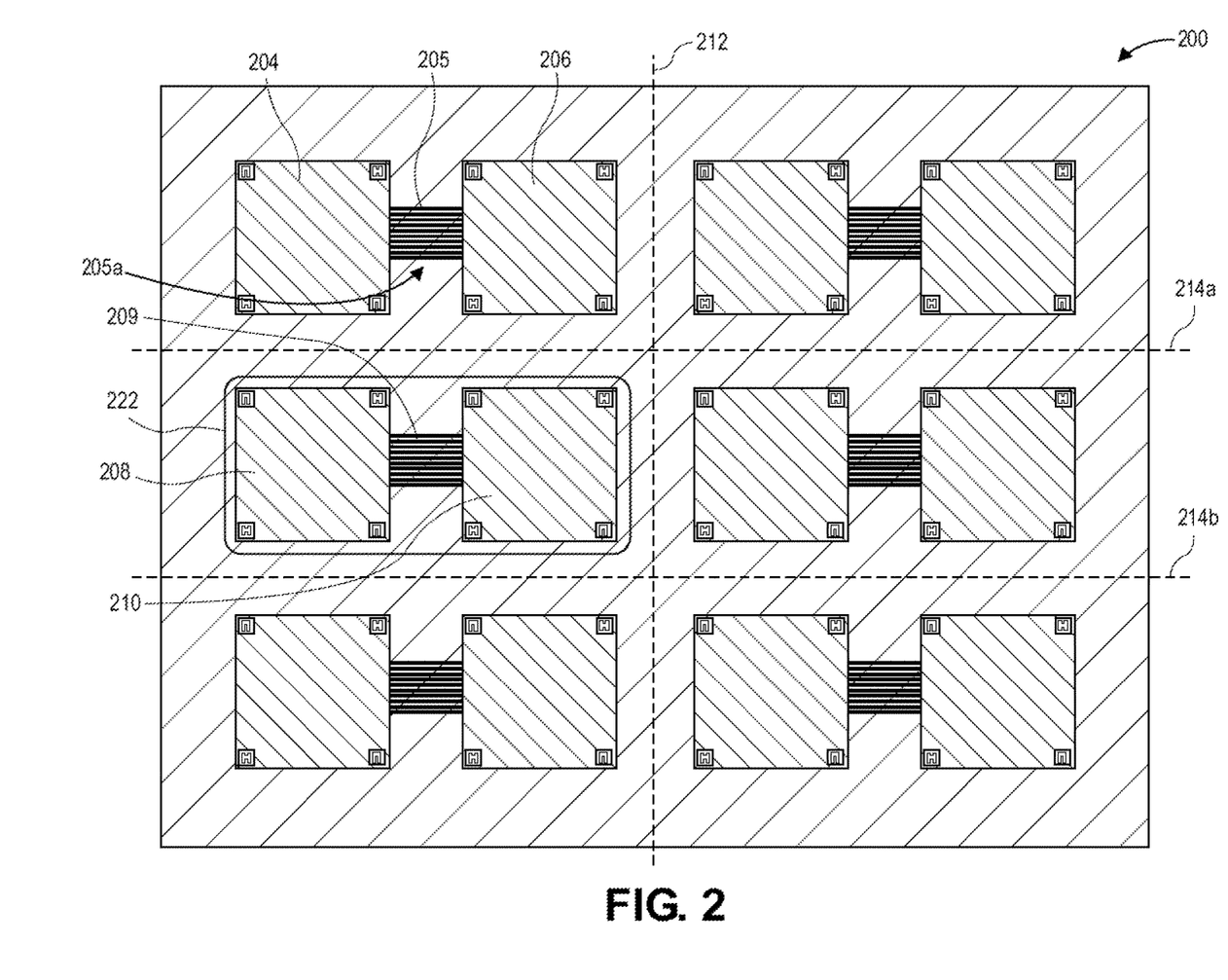
FIG. 2 shows a top-down view of a wafer that includes a plurality of stitched dies prior to singulation, in accordance with various embodiments.

FIG. 2 shows a top-down view of a wafer that includes a plurality of stitched dies prior to singulation, in accordance with various embodiments. Wafer portion 200, which may be similar to wafer 100 of FIG. 1, shows a plurality of dies that coupled together with one or more electrical connections, which may also be referred to as stitched together. For example, a first die 204 and a second die 206 may be electrically coupled, or stitched together, using electrical connections 205. In another example, a third die 208 and a fourth die 210 may be electrically coupled using electrical connections 209.

Dicing streets 212, 214a, 214b are used to singulate the stitched first die 204 and the second die 206, from the stitched third die 208 and fourth die 210. However, after singulation, moisture may intrude within the substrate edge next to electrical connections 205a and move toward the electrical connections 205, where the moisture may cause corrosion or fatigue stress cracks during operation over time.

However, in embodiments, a hermetic barrier 222 may be formed around the third die 208 and the fourth die 210 that will prevent any moisture from approaching the electrical connections 209 from an edge of the substrate after singulation. In embodiments, the hermetic barrier may be formed using a TSV-like process as described further below. In embodiments, the hermetic barrier 222 may have a width ranging from 5 µm-30 µm, and a height ranging from 5 µm-30 µm.

Figure 3A:
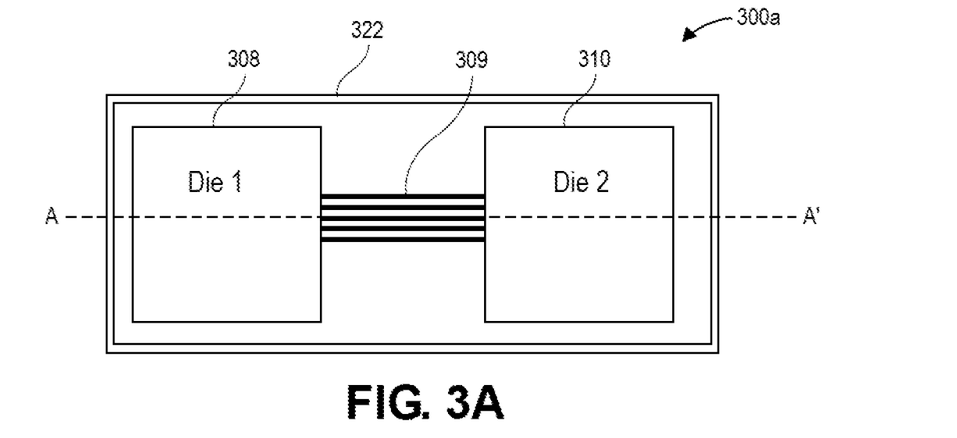
FIGS. 3A-3C show a top-down view and side views of a two stitched dies that include a barrier to provide a hermetic seal around the dies and electrical connections coupling the dies, in accordance with various embodiments.
Figure 3B:
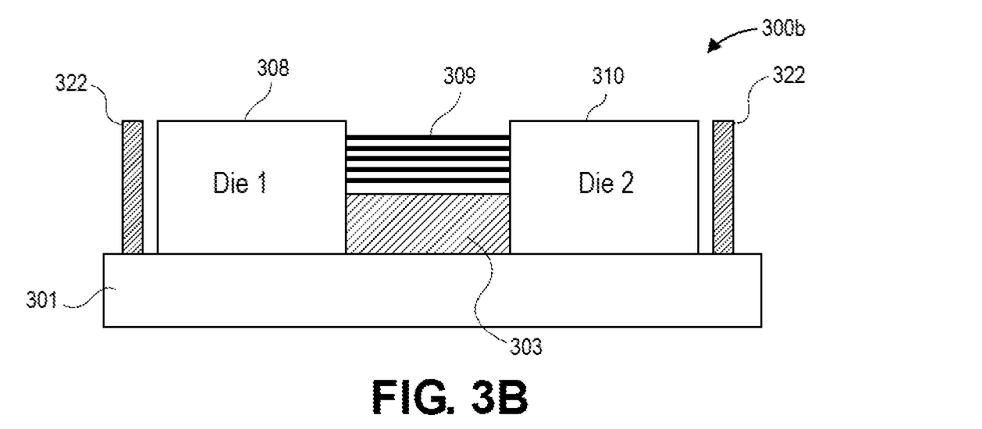
Figure 3C:
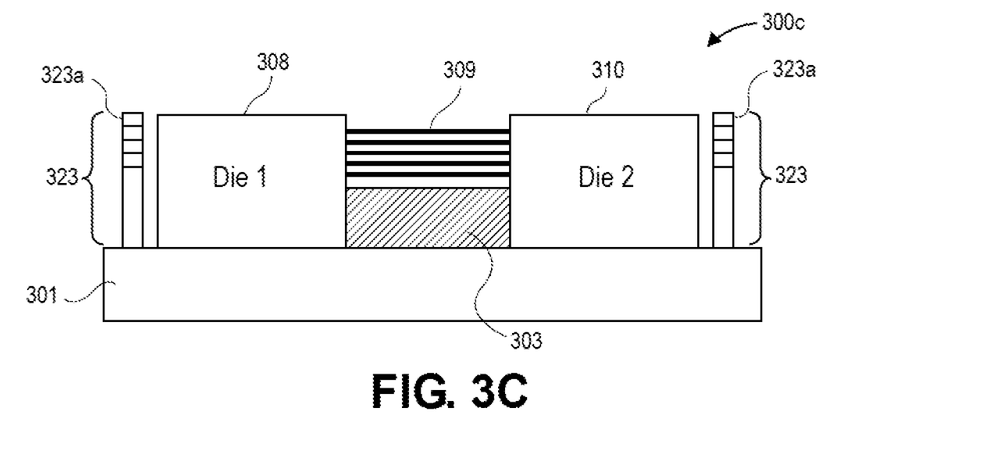

FIGS. 3A-3C show a top-down view and side views of a two stitched dies that include a barrier to provide a hermetic seal around the dies and electrical connections coupling the dies, in accordance with various embodiments. FIG. 3A shows a top-down view of a wafer portion 300a, which may be similar to wafer portion 200 of FIG. 2. Wafer portion 300a includes a first die 308, a second die 310, and one or more electrical connections 309, which may be similar to third die 208, fourth die 210, and electrical connections 209 of FIG. 2. A hermetic barrier 322, which may be similar to hermetic barrier 222 of FIG. 2 surrounds the first die 308, the second die 310 and the one or more electrical connections 309.

FIG. 3B shows a cross section side view of A-A' of FIG. 3A. Wafer portion 300b shows first die 308 and second die 310 electrically coupled with the one or more electrical connections 309. Note that the one or more electrical connections 309 may be in multiple layers as shown. A layer 303 below the electrical connections 309 may be a metal or a dielectric which may form some monitor structures for wafer manufacturing. The barrier 322 extends from a substrate 301, which may be a silicon substrate, in a substantially perpendicular fashion to the substrate 301 to a height of the first die 308. As shown, the barrier 322 may be a single piece of metal created by a TSV-like process. In embodiments, a trench with the shape of the barrier 322 may be formed around the first die 308, the second die 310 and the electrical connections 309 using TSV trench techniques. After the trench is formed, a metal may be placed within the trench to form the barrier 322.

FIG. 3C shows a cross section side view A-A' of FIG. 3A. Wafer portion 300c shows first die 308 and second die 310 electrically coupled with the one or more electrical connections 309. A layer 303 below the electrical connections 309 may be a metal or a dielectric which may form some monitor structures for wafer manufacturing.

A barrier 323, which may be similar to barrier 322, extends from a substrate 301, which may be a silicon substrate, in a substantially perpendicular fashion to the substrate 301 to a height of the first die 308. As shown, the hermetic barrier 323 may be created using a combination of TSV-like high aspect ratio process and a layer-by-layer metal and dielectric process. The stacked metal layers 323a above the TSV may be in layers used for electrical connections between dies. In embodiments, the fabrication process may include laying down the edge ring formed through TSV-like processes first, then layer-by-layer metal brick 323a above the TSV are made. Both the TSV and metal layer may include etching and metallization.

As shown with respect to FIGS. 3A-3C, the barrier 322, 323 will prevent moisture from entering into a side of the partial wafer 300a, 300b, 300c and contacting the electrical connections 309.

Figure 4:
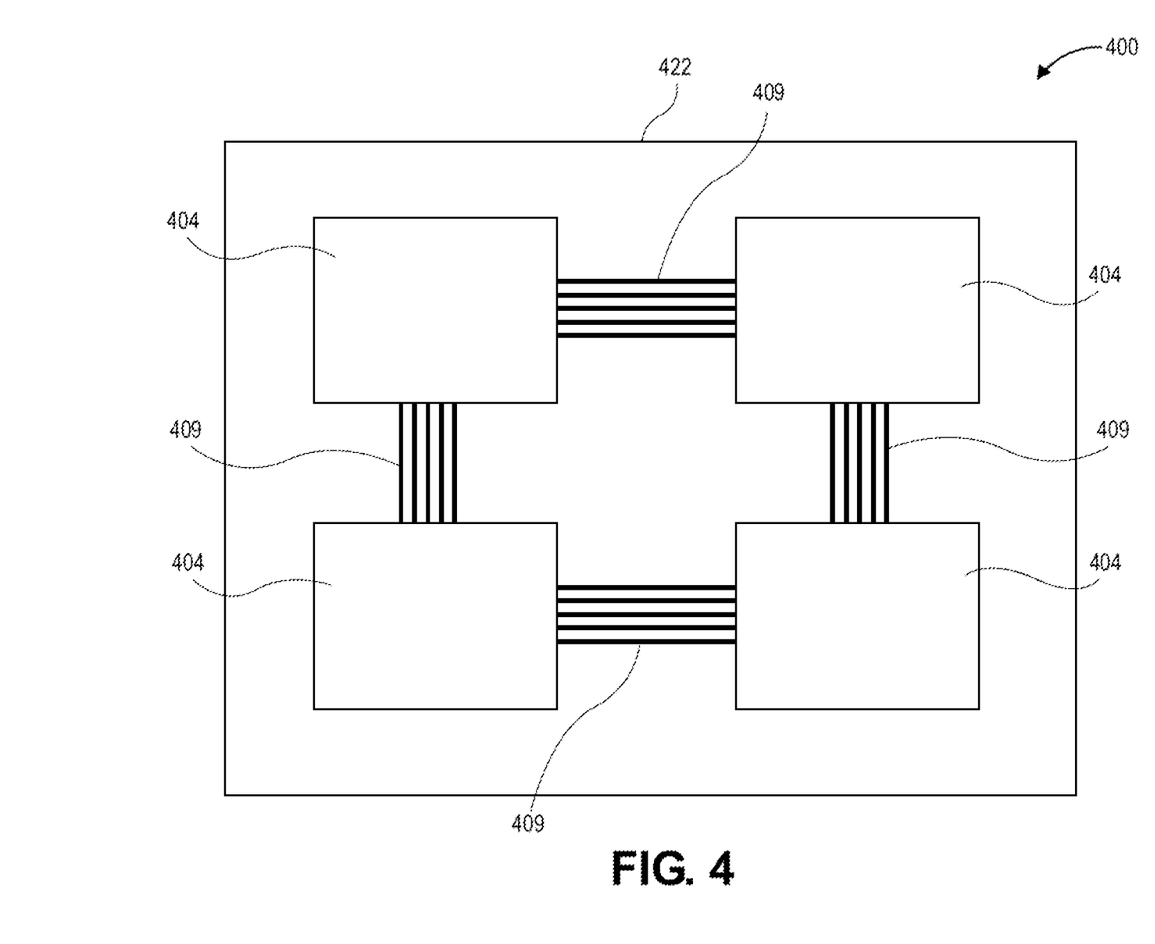
FIG. 4 shows a top-down view of a wafer that includes a plurality of stitched dies that include a barrier to provide a hermetic seal around the dies and electrical connections coupling the dies, in accordance with various embodiments.

FIG. 4 shows a top-down view of a wafer that includes a plurality of stitched dies that include a barrier to provide a hermetic seal around the dies and electrical connections coupling the dies, in accordance with various embodiments. Partial wafer 400, which may be similar to wafer portion 200 of FIG. 2, shows a hermetic barrier 422, which may be similar to barrier 322 FIG. 3. The barrier 422 surrounds a plurality of dies 404 that are electrically coupled with each other using one or more electrical connectors 409, which may be similar to one or more electrical connectors 309 of FIG. 3. In other embodiments, there may be an arbitrary number of dies that are stitched together in this fashion, that have their edges protected by a hermetic barrier 422 that will prevent moisture from entering into a side of the one or more electrical connectors 409.

Figure 5A:
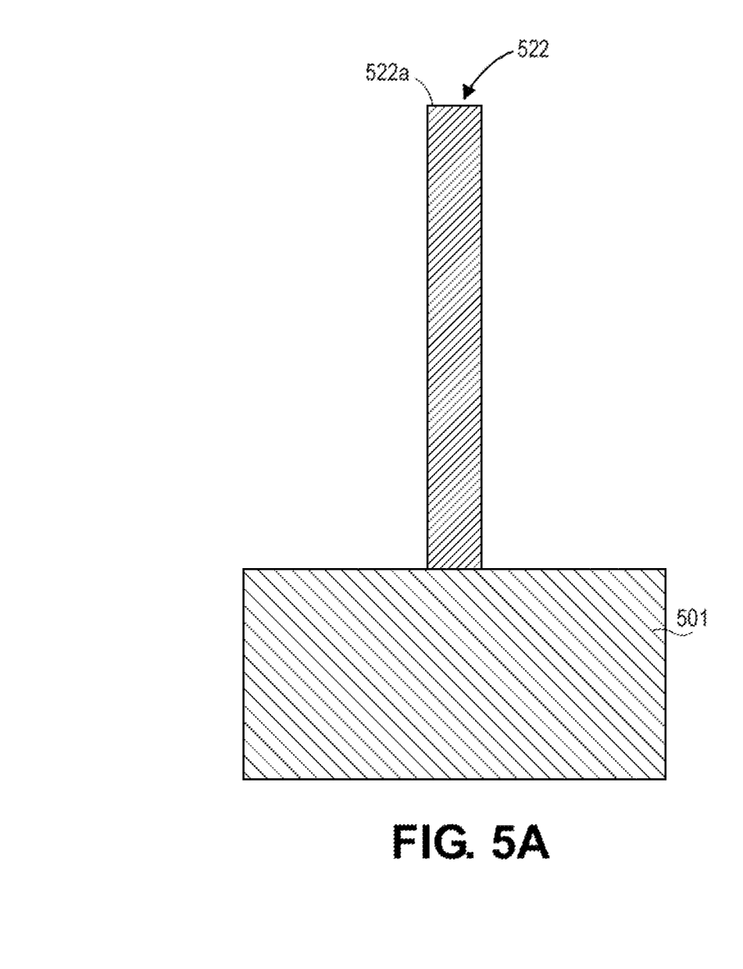
FIGS. 5A-5B show side views of implementations of a hermetic barrier, in accordance with various embodiments

FIGS. 5A-5B show side views of implementations of a hermetic barrier, in accordance with various embodiments. FIG. 5A shows a cross section side view of barrier 522 that is coupled with a silicon substrate 501, which may be similar to barrier 322 and silicon substrate 301 of FIG. 3B. A top of the barrier 522a may be approximately at a height of a top of a die (not shown), which may be similar to die 308 of FIG. 3B. The barrier 522 extends in a solid piece of metal that was formed after a TSV trench was created and filled with metal.

Figure 5B:
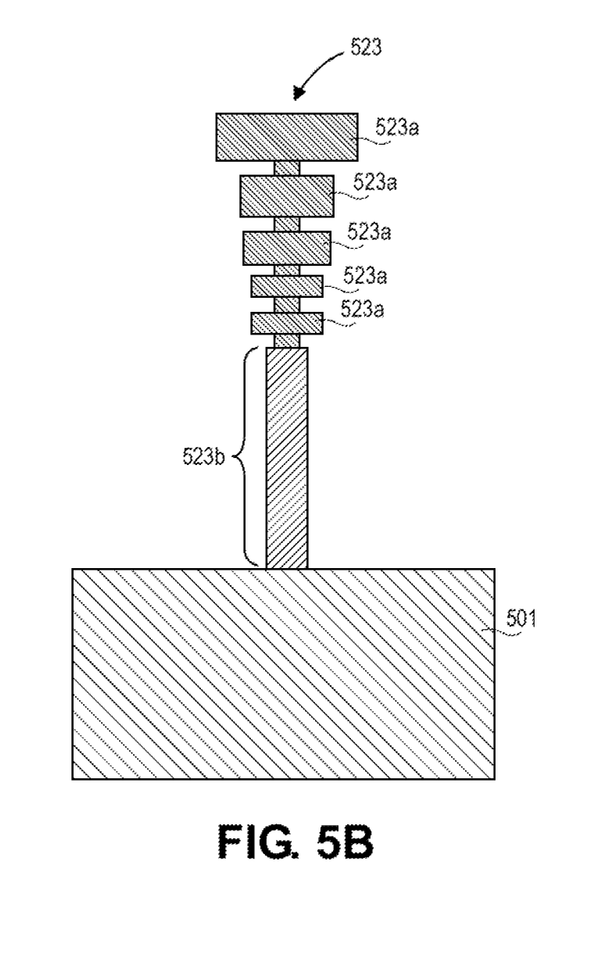

FIG. 5B shows a cross section side view of a barrier 523, which may be similar to barrier 323 of FIG. 3C. In creating barrier 523, a TSV trench was created down to silicon substrate 501, and then the TSV trench was subsequently filled with metal to create barrier portion 523b. At a top of the barrier portion 523b, layers of the wafer, such as wafer portion 300c of FIG. 3C, may be applied as part of the manufacturing process, where stacked metal layers 523a will create the remainder of the barrier 523.

Figure 6:
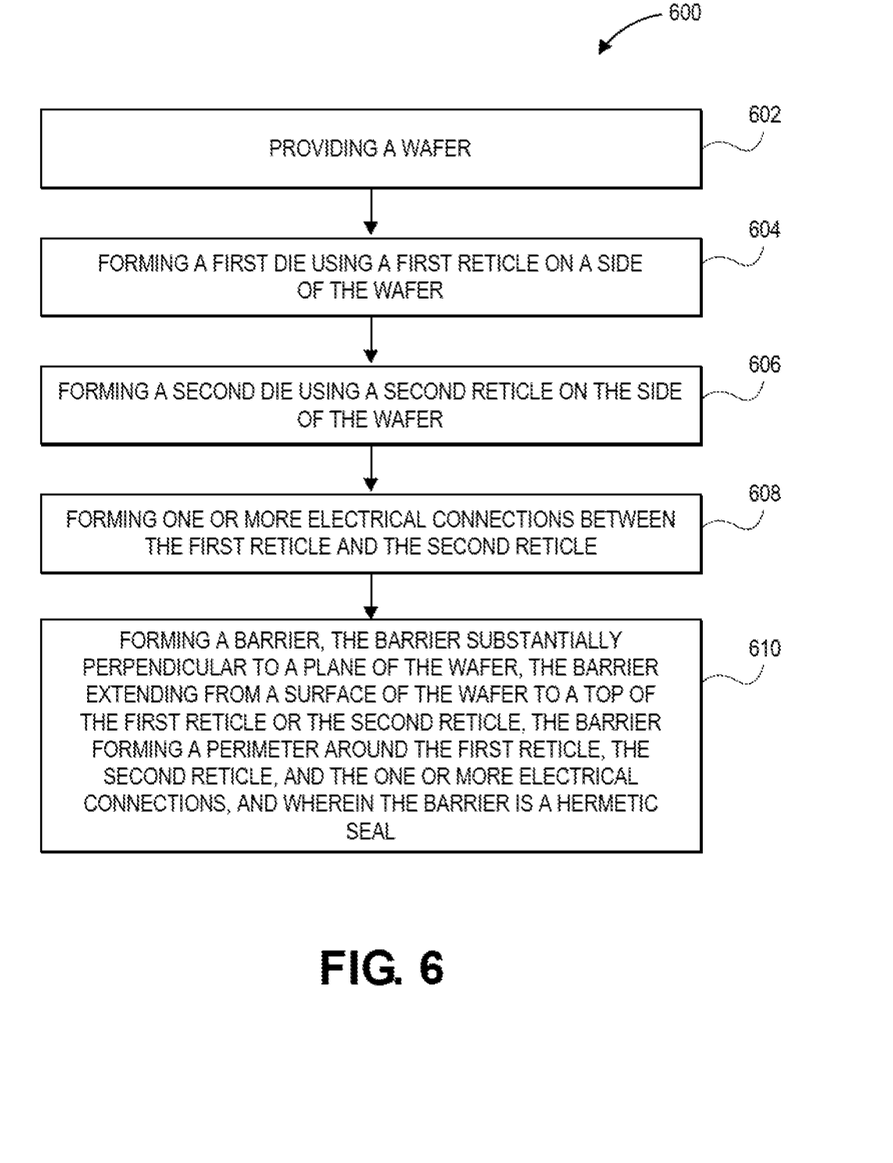
FIG. 6 illustrates an example process for manufacturing a wafer that includes a barrier to provide a hermetic seal, in accordance with various embodiments.

FIG. 6 illustrates an example process for manufacturing a wafer that includes a barrier to provide a hermetic seal, in accordance with various embodiments. Process 600 may be implemented using the techniques and/or embodiments described herein, and in particular with respect to FIGS. 1-5B and 7A-9.

At block 602, the process may include providing a wafer. The wafer may be similar to wafer portion 200 of FIG. 2, or may be similar to wafer 100 of FIG. 1.

At block 604, the process may further include forming a first die using a first reticle on a side of the wafer. In embodiments, the first die may be similar to third die 208 of FIG. 2.

At block 606, the process may further include forming a second die using a second reticle on the side of the wafer. In embodiments, the second die may be similar to fourth die 210 of FIG. 2.

At block 608, the process may further include forming one or more electrical connections between the first die and the second die. In embodiments, the one or more electrical connections may be similar to electrical connections 209 of FIG. 2.

At block 610, the process may further include forming a barrier, the barrier substantially perpendicular to a plane of the wafer, the barrier extending from a surface of the wafer to a top of the first die or the second die, the barrier forming a perimeter around the first die, the second die, and the one or more electrical connections, and wherein the barrier is a hermetic seal. In embodiments, the barrier may be similar to hermetic barrier 222 of FIG. 2, hermetic barrier 322 of FIG. 3B, hermetic barrier 323 of FIG. 3C, or hermetic barrier 422 of FIG. 4.

In embodiments with respect to blocks 602-610, the first reticle and the second reticle may be the same reticle. In embodiments, the first reticle and the second reticle may have the same design. In embodiments, the first reticle and the second reticle may have similar designs.

Figure 7A:
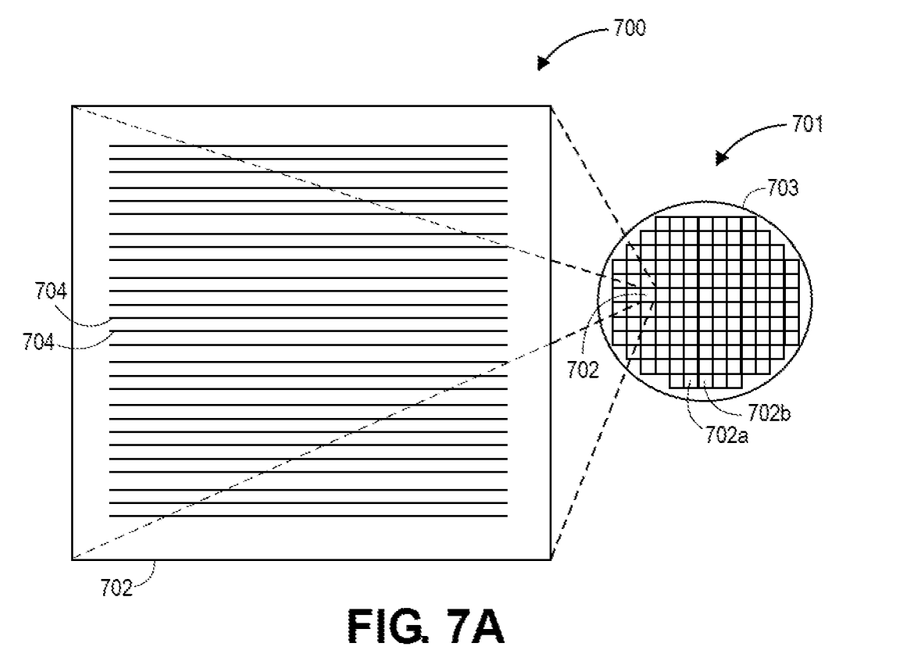
FIGS. 7A-7B schematically illustrate a top view of an example die in wafer form and in singulated form, and a cross section side view of a package assembly, in accordance with various embodiments.
Figure 7B:
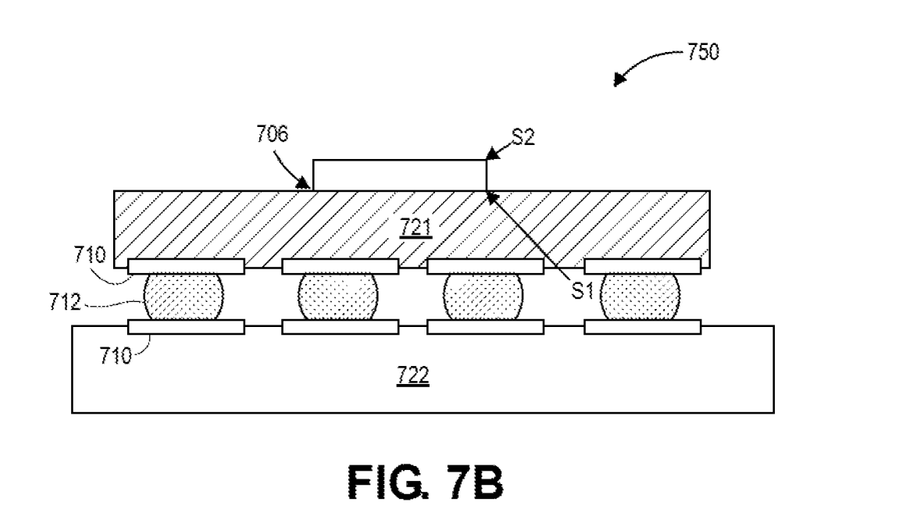

FIGS. 7A-7B schematically illustrate a top view of an example die in wafer form and in singulated form, and a cross section side view of a package assembly, in accordance with various embodiments. FIG. 7A schematically illustrates a top view of an example die 702 in a wafer form 701 and in a singulated form 700, in accordance with some embodiments. In some embodiments, die 702 may be one of a plurality of dies, e.g., dies 702, 702a, 702b, of a wafer 703 comprising semiconductor material, e.g., silicon or other suitable material. The plurality of dies, e.g., dies 702, 702a, 702b, may be formed on a surface of wafer 703. At least one of the plurality of dies may be surrounded by a hermetic barrier on the wafer 703, where the plurality of dies is cut during a singulation process. The hermetic barrier may be used to protect electrical pathways between the plurality of dies, and may be formed using techniques as described herein.

Each of the dies 702, 702a, 702b, may be a repeating unit of a semiconductor product that includes devices as described herein. For example, die 702 may include circuitry having transistor elements such as, for example, one or more channel bodies 704 (e.g., fin structures, nanowires, and the like) that provide a channel pathway for mobile charge carriers in transistor devices. Although one or more channel bodies 704 are depicted in rows that traverse a substantial portion of die 702, it is to be understood that one or more channel bodies 704 may be configured in any of a wide variety of other suitable arrangements on die 702 in other embodiments.

After a fabrication process of the device embodied in the dies is complete, wafer 703 may undergo a singulation process in which some of the dies, e.g., die 702, are separated from one another to provide discrete "chips" of the semiconductor product. Wafer 703 may be any of a variety of sizes. In some embodiments, wafer 703 has a diameter ranging from about 25.4 mm to about 450 mm. Wafer 703 may include other sizes and/or other shapes in other embodiments. According to various embodiments, the one or more channel bodies 704 may be disposed on a semiconductor substrate in wafer form 701 or singulated form 700. One or more channel bodies 704 described herein may be incorporated in die 702 for logic, memory, or combinations thereof. In some embodiments, one or more channel bodies 704 may be part of a system-on-chip (SoC) assembly.

FIG. 7B schematically illustrates a cross-section side view of an integrated circuit (IC) assembly 750, in accordance with some embodiments. In some embodiments, IC assembly 750 may include one or more dies, e.g., die 702, hybrid bonded using techniques described herein to package substrate 721. Die 702 may include one or more channel bodies 704 that serve as channel bodies of multi-threshold voltage transistor devices. In some embodiments, package substrate 721 may be electrically coupled with a circuit board 722 as is well known to a person of ordinary skill in the art. Die 702 may represent a discrete product made from a semiconductor material (e.g., silicon) using semiconductor fabrication techniques such as thin film deposition, lithography, etching, and the like used in connection with forming Complementary Metal Oxide Semiconductor (CMOS) devices. In some embodiments, die 702 may be, include, or be a part of a processor, memory, SoC or ASIC in some embodiments.

Die 702 can be attached to package substrate 721 according to a wide variety of suitable configurations including, for example, being directly coupled with package substrate 721 in a flip-chip configuration, as depicted. In the flip-chip configuration, an active side S1 of die 702 including circuitry is attached to a surface of package substrate 721 using hybrid bonding structures as described herein that may also electrically couple die 702 with package substrate 721. Active side S1 of die 702 may include multi-threshold voltage transistor devices as described herein. An inactive side S2 of die 702 may be disposed opposite to active side S1.

In some embodiments, package substrate 721 is an epoxy-based laminate substrate having a core and/or build-up layers such as, for example, an Ajinomoto Build-up Film (ABF) substrate. Package substrate 721 may include other suitable types of substrates in other embodiments including, for example, substrates formed from glass, ceramic, or semiconductor materials.

Package substrate 721 may include electrical routing features configured to route electrical signals to or from die 702. The electrical routing features may include pads or traces (not shown) disposed on one or more surfaces of package substrate 721 and/or internal routing features (not shown) such as trenches, vias, or other interconnect structures to route electrical signals through package substrate 721. In some embodiments, package substrate 721 may include electrical routing features such as pads (not shown) configured to receive the respective die-level interconnect structures 706 of die 702.

Circuit board 722 may be a printed circuit board (PCB) comprising an electrically insulative material such as an epoxy laminate. Circuit board 722 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 702 through circuit board 722. Circuit board 722 may comprise other suitable materials in other embodiments. In some embodiments, circuit board 722 is a motherboard as is well known to a person of ordinary skill in the art.

Package-level interconnects such as, for example, solder balls 712 may be coupled to one or more pads 710 on package substrate 721 and/or on circuit board 722 to form corresponding solder joints that are configured to further route the electrical signals between package substrate 721 and circuit board 722. Pads 710 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 721 with circuit board 722 may be used in other embodiments.

IC assembly 750 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 702 and other components of IC assembly 750 may be used in some embodiments.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
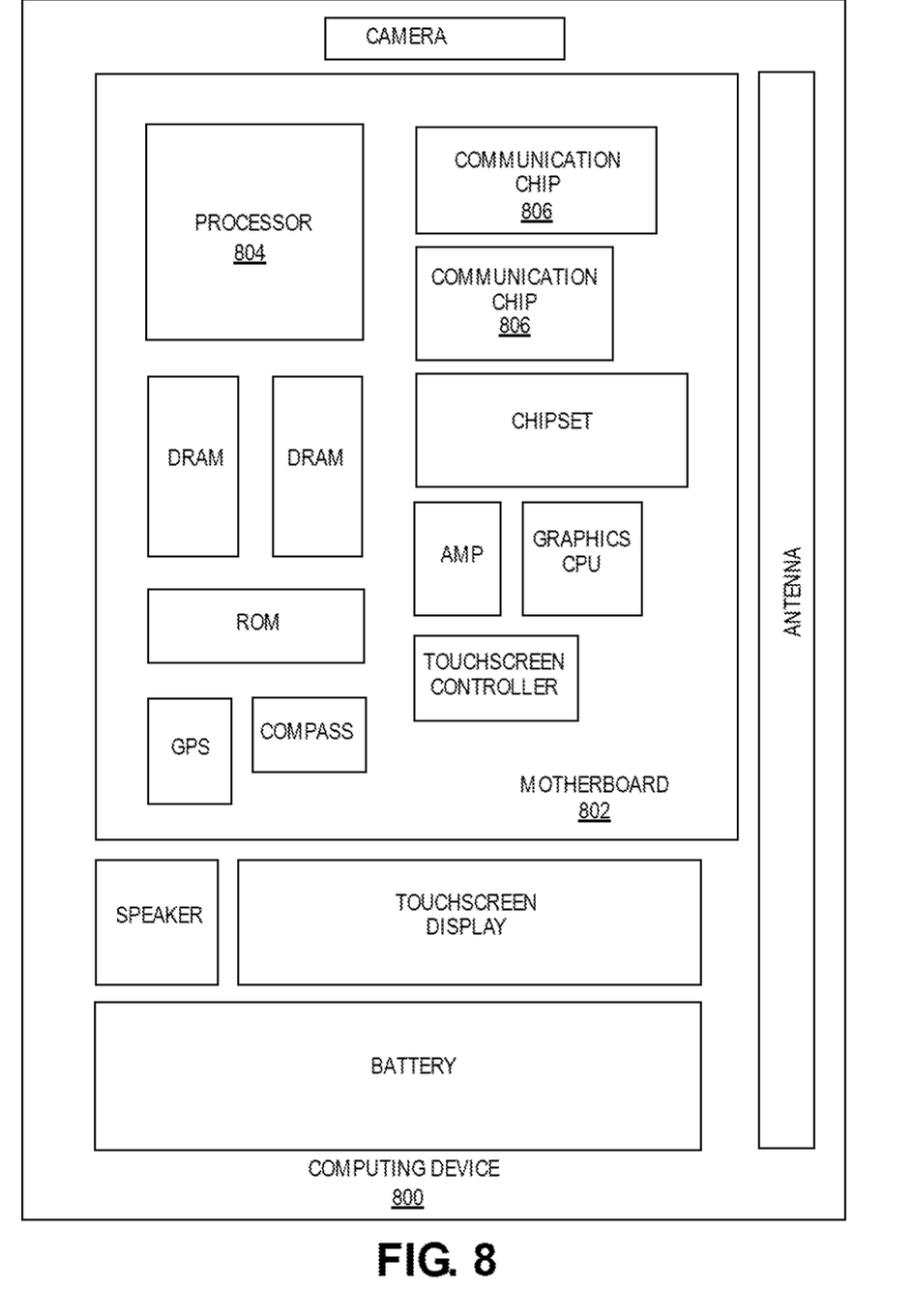
FIG. 8 illustrates a computing device 800 in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
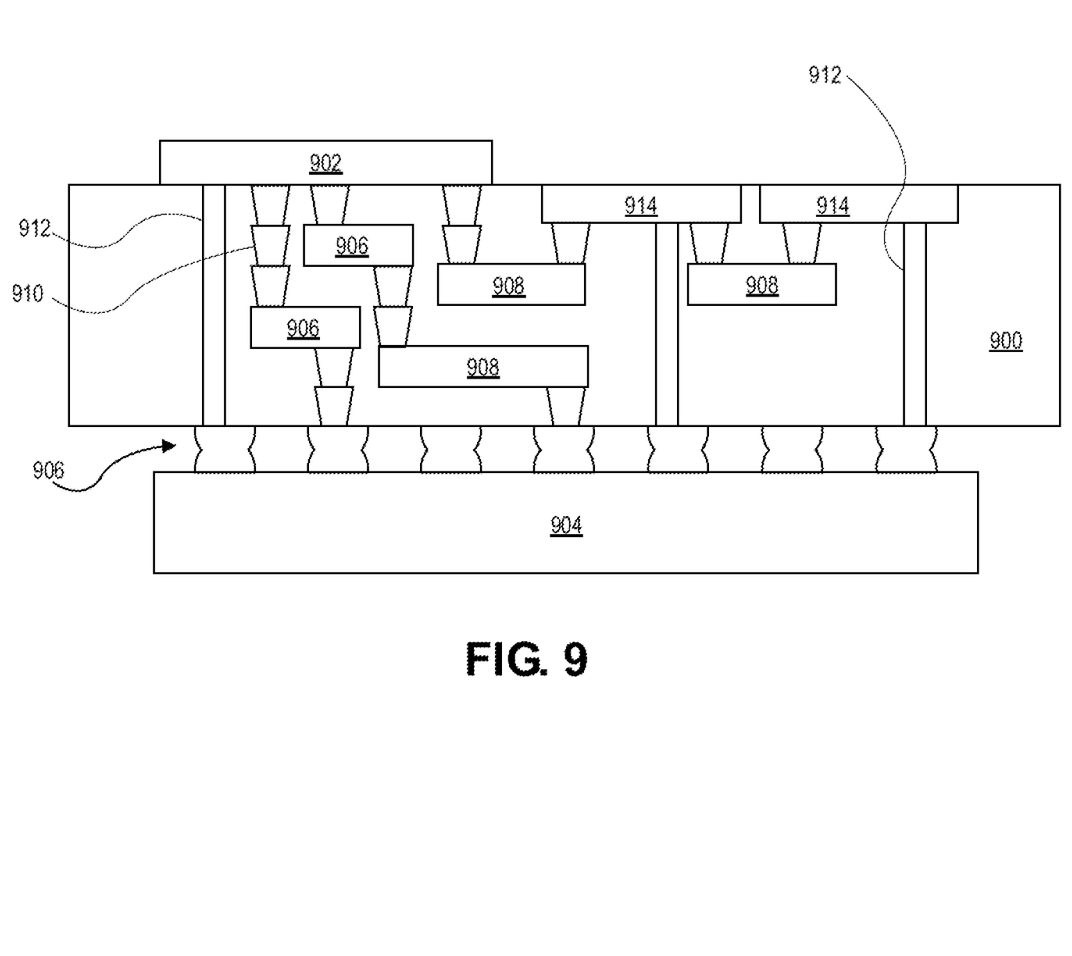
FIG. 9 illustrates an interposer 900 that includes one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

Examples

Example 1 is an apparatus comprising: a wafer; a first die on a side of the wafer; a second die on the side of the wafer; one or more electrical connections electrically coupling the first die and the second die; and a barrier surrounding the first die, the second die, and the one or more electrical connections, wherein the barrier extends from the wafer to a top of the first die or the second die, and wherein the barrier is a hermetic barrier.

Example 2 may include the apparatus of example 1, or of any other example or embodiment herein, wherein the barrier is substantially perpendicular to a plane of the wafer.

Example 3 may include the apparatus of example 1, or of any other example or embodiment herein, wherein the barrier is a metal barrier.

Example 4 may include the apparatus of example 3, or of any other example or embodiment herein, wherein the metal barrier includes copper.

Example 5 may include the apparatus of example 3, or of any other example or embodiment herein, wherein the metal barrier is formed by a plurality of metal layers that are stacked on each other.

Example 6 may include the apparatus of example 1, or of any other example or embodiment herein, wherein the one or more electrical connections are within a plane that is proximate to a top portion of the first die and a top portion of the second die.

Example 7 may include the apparatus of example 1, or of any other example or embodiment herein, wherein a bottom portion of the barrier coupled with the side of wafer includes silicon, and an upper portion of the barrier coupled with the bottom portion of the barrier includes metal.

Example 8 may include the apparatus of example 1, or of any other example or embodiment herein, further comprising a top layer hermetically coupled with a top of the barrier and above the first die and the second die, wherein the top layer, the barrier, and the wafer hermetically seals the first die, the second die, and the one or more electrical connections.

Example 9 may include the apparatus of example 1, or of any other example or embodiment herein, wherein the one or more electrical connections are a first set of one or more electrical connections; and further comprising: a third die on the side of the wafer; a second set of one or more electrical connections electrically coupling the first die and the third die; and wherein the barrier surrounds the first die, the second die, the third die, the first set of one or more electrical connections, and the second set of one or more electrical connections.

Example 10 may include the apparatus of example 1, or of any other example or embodiment herein, wherein the barrier is a first barrier, and the one or more electrical connections is a first set of one or more electrical connections; and further comprising: a third die on the side of the wafer; a fourth die on the side of the wafer; a second set of one or more electrical connections electrically coupling the third die and the fourth die; and a second barrier surrounding the third die, the fourth die, and the second set of one or more electrical connections, wherein the second barrier extends from the wafer to a top of the third die or the fourth die, and wherein the second barrier is a hermetic barrier.

Example 11 may include the apparatus of example 10, or of any other example or embodiment herein, wherein the first barrier and the second barrier are on opposite sides of a dicing line on the wafer.

Example 12 may include the apparatus of example 1, or of any other example or embodiment herein, wherein the first die or the second die include a plurality of transistors.

Example 13 is a method comprising: providing a wafer; forming a first die using a first reticle on a side of the wafer; forming a second die using a second reticle on the side of the wafer; forming one or more electrical connections between the first die and the second die; and forming a barrier, the barrier substantially perpendicular to a plane of the wafer, the barrier extending from a surface of the wafer to a top of the first die or the second die, the barrier forming a perimeter around the first die, the second die, and the one or more electrical connections, and wherein the barrier is a hermetic seal.

Example 14 may include the method of example 13, or of any other example or embodiment herein, wherein forming the barrier further includes: forming a trench; and filling the formed trench with a metal.

Example 15 may include the method of example 14, or of any other example or embodiment herein, wherein forming the trench further includes forming the trench using through silicon vias (TSV).

Example 16 may include the method of example 14, or of any other example or embodiment herein, wherein the metal includes copper.

Example 17 may include the method of example 13, or of any other example or embodiment herein, further including: applying a top layer that is hermetically coupled with a top of the barrier and above the first die and the second die.

Example 18 is a package comprising: a substrate including: a silicon layer; a first die on a side of the silicon layer and a second die on the side of the silicon layer; one or more electrical connections electrically coupling the first die and the second die; a barrier surrounding the first die, the second die, and the one or more electrical connections, wherein the barrier extends from the side of the silicon layer to a top of the first die or the second die, and wherein the barrier is a hermetic barrier; and a top layer of the substrate that is hermetically coupled with a top of the barrier and above the first die and the second die, wherein the top layer of the substrate, the barrier, and the silicon layer hermetically seals the one or more electrical connections.

Example 19 may include the package of example 18, or of any other example or embodiment herein, wherein the barrier is substantially perpendicular to a plane of the silicon layer.

Example 20 may include the package of example 18, or of any other example or embodiment herein, wherein the barrier is a metal barrier that includes copper.

What is claimed is:

1. An apparatus comprising:
a silicon substrate;
a first die on a side of the silicon substrate;
a second die on the side of the silicon substrate;
one or more electrical connections electrically coupling the first die and the second die; and
a barrier completely laterally surrounding the first die, the second die, and the one or more electrical connections, wherein the barrier extends from the silicon substrate to a top of the first die or the second die, and wherein the barrier is a hermetic barrier.

2. The apparatus of claim 1, wherein the barrier is substantially perpendicular to a plane of the silicon substrate.

3. The apparatus of claim 1, wherein the barrier is a metal barrier.

4. The apparatus of claim 3, wherein the metal barrier includes copper.

5. The apparatus of claim 3, wherein the metal barrier is formed by a plurality of metal layers that are stacked on each other.

6. The apparatus of claim 1, wherein the one or more electrical connections are within a plane that is proximate to a top portion of the first die and a top portion of the second die.

7. The apparatus of claim 1, wherein a bottom portion of the barrier coupled with the side of the silicon substrate includes silicon, and an upper portion of the barrier coupled with the bottom portion of the barrier includes metal.

8. The apparatus of claim 1, further comprising
a top layer hermetically coupled with a top of the barrier and above the first die and the second die, wherein the top layer, the barrier, and the silicon substrate hermetically seals the first die, the second die, and the one or more electrical connections.

9. The apparatus of claim 1, wherein the one or more electrical connections are a first set of one or more electrical connections; and further comprising:
a third die on the side of the silicon substrate;
a second set of one or more electrical connections electrically coupling the first die and the third die; and
wherein the barrier surrounds the first die, the second die, the third die, the first set of one or more electrical connections, and the second set of one or more electrical connections.

10. The apparatus of claim 1, wherein the barrier is a first barrier, and the one or more electrical connections is a first set of one or more electrical connections; and further comprising:
a third die on the side of the silicon substrate;
a fourth die on the side of the silicon substrate;
a second set of one or more electrical connections electrically coupling the third die and the fourth die; and
a second barrier surrounding the third die, the fourth die, and the second set of one or more electrical connections, wherein the second barrier extends from the silicon substrate to a top of the third die or the fourth die, and wherein the second barrier is a hermetic barrier.

11. The apparatus of claim 10, wherein the first barrier and the second barrier are on opposite sides of a dicing line on the silicon substrate.

12. The apparatus of claim 1, wherein the first die or the second die include a plurality of transistors.

13. A method comprising:
providing a silicon substrate;
forming a first die using a first reticle on a side of the silicon substrate;
forming a second die using a second reticle on the side of the silicon substrate;
forming one or more electrical connections between the first die and the second die; and forming a barrier, the barrier substantially perpendicular to a plane of the silicon substrate, the barrier extending from a surface of the silicon substrate to a top of the first die or the second die, the barrier forming a perimeter completely laterally surrounding the first die, the second die, and the one or more electrical connections, and wherein the barrier is a hermetic seal.

14. The method of claim 13, wherein forming the barrier further includes:
   forming a trench; and
   filling the formed trench with a metal.

15. The method of claim 14, wherein forming the trench further includes forming the trench using through silicon vias (TSV).

16. The method of claim 14, wherein the metal includes copper.

17. The method of claim 13, further including:
   applying a top layer that is hermetically coupled with a top of the barrier and above the first die and the second die.

18. A package comprising:
   a substrate including:
     a silicon layer;
     a first die on a side of the silicon layer and a second die on the side of the silicon layer;
     one or more electrical connections electrically coupling the first die and the second die;
     a barrier completely laterally surrounding the first die, the second die, and the one or more electrical connections, wherein the barrier extends from the side of the silicon layer to a top of the first die or the second die, and wherein the barrier is a hermetic barrier; and
     a top layer of the substrate that is hermetically coupled with a top of the barrier and above the first die and the second die, wherein the top layer of the substrate, the barrier, and the silicon layer hermetically seals the one or more electrical connections.

19. The package of claim 18, wherein the barrier is substantially perpendicular to a plane of the silicon layer.

20. The package of claim 18, wherein the barrier is a metal barrier that includes copper.

* * * * *